United States Patent [19]

Aoshima

[11] Patent Number: 5,201,977
[45] Date of Patent: * Apr. 13, 1993

[54] PROCESS FOR PRODUCING STRUCTURES FROM SYNTHETIC SINGLE-CRYSTAL PIECES

[76] Inventor: Hiroaki Aoshima, 4-34-14 Yayoicho, Nakano ku, Tokyo, Japan

[*] Notice: The portion of the term of this patent subsequent to May 7, 2008 has been disclaimed.

[21] Appl. No.: 560,838

[22] Filed: Jul. 31, 1990

[30] Foreign Application Priority Data

Aug. 9, 1989 [JP] Japan .................................. 1-207212
Apr. 27, 1990 [JP] Japan .................................. 2-112568

[51] Int. Cl.⁵ .......................... B32B 31/22; G02B 1/02
[52] U.S. Cl. ...................................... 156/153; 156/89;
156/99; 156/281; 264/1.2; 264/67; 501/86;
501/120; 359/885
[58] Field of Search .................... 156/89, 153, 281, 99,
156/309.6, 629, 645; 252/584; 264/1.2, 67;
423/264; 501/86, 120; 350/311, 313, 316;
437/62, 947; 148/DIG. 12, DIG. 150, DIG. 135

[56] References Cited

U.S. PATENT DOCUMENTS

| | | | |
|---|---|---|---|
| 3,950,596 | 4/1976 | Carr et al. ............................... | 501/86 |
| 4,407,566 | 10/1983 | Rosenberg et al. .................. | 350/404 |
| 4,671,846 | 6/1987 | Shimbo et al. ....................... | 156/629 |
| 4,721,541 | 1/1988 | Hodges ................................. | 264/67 |
| 4,800,474 | 1/1989 | Bornhorst ........................... | 350/316 |
| 4,897,770 | 1/1990 | Solomon ............................... | 350/316 |
| 4,925,608 | 5/1990 | Rossi et al. .............................. | 264/67 |
| 4,939,101 | 7/1990 | Black et al. ....................... | 437/225 X |
| 5,013,380 | 5/1991 | Aoshima .............................. | 156/256 |
| 5,087,307 | 2/1992 | Nomura et al. .................. | 156/153 X |

OTHER PUBLICATIONS

"Synthetic Sapphire Production Reaches Commercial Scale in U.S.", Linde Air Products Co., Reprint F-56-70-P-15660, Oct., 1943.

Primary Examiner—Michael W. Ball
Assistant Examiner—Francis J. Lorin
Attorney, Agent, or Firm—David O'Reilly

[57] ABSTRACT

A process for producing structures from synthetic single-crystal pieces having identical major component and crystal systems by chemically bonding to produce integration and simulation. The process of the present invention makes structures of synthetic single-crystals that are placed together like non-crystals. Therefore, with the process of the present invention, new synthetic single-crystal structures of larger or smaller complicated precise shapes having applications in optical, chemical, and physical fields may be produced. The structures from synthetic single-crystal pieces are comprised of a plurality of colorless synthetic single-crystals or colored synthetic single-crystals having the same prime component and either no color or color impurities contained therein. The synthetic single-crystal pieces are optically polished on both parallel ends which intersect at a particular crystal axes with a particular angle and the polished optical end faces are optically bonded with identical axes, identical axial angle, and identical axial ratio. The single-crystal pieces are all uniformly heated to chemically combine them to integrate them together to produce a filter structure having a particular predetermined spectrum of transmission or absorption.

12 Claims, 5 Drawing Sheets

$a(a_1 \cdot a_2 \cdot a_3 \cdot a_4 \cdot a_5)$
$b(b_1 \cdot b_2 \cdot b_3 \cdot b_4 \cdot b_5)$
$c(c_1 \cdot c_2 \cdot c_3 \cdot c_4 \cdot c_5)$

PROCESS FOR PRODUCING STRUCTURES FROM SYNTHETIC SINGLE-CRYSTAL PIECES

FIELD OF THE INVENTION

The present invention relates to a process for producing structures from synthetic single-crystal pieces forming an identical major component and crystal system by chemical bonding, integration and assimilation without using any medium such as an adhesive; more specifically to sapphire, but also to synthetic corundum, quartz crystal, and synthetic spinel, or the like.

BACKGROUND OF THE INVENTION

Heretofore, a single-crystal is made up to a solid phase in the usual way of a raw material being grown from gas and liquid phases to a solid phase. In the gas and liquid phases, the raw material is heated to evaporate or melted at a high temperature, or are made into a solution with a proper solvent in which the raw material is divided into separate atoms and molecules until it can be made to grow to a crystal.

In the solid phase, a multi-crystal raw material is heated, as its shape is retained, to make a solid phase reaction. In the reaction, it can release distortion energy to grow to a single-crystal. There is a great difference between a solid phase and a gas or liquid phase. As described above, the process of the present invention can obtain a large, complicated precise shape of a synthetic single-crystal unit as it is a method in which a plurality of synthetic single-crystals can be chemically combined to integrate and assimilate together without damaging the crystal structure of the already-grown synthetic single-crystals made up to a solid phase and gas or liquid phase.

PROBLEMS TO BE SOLVED BY THE INVENTION

To make a single-crystal, as mentioned above, there are two ways: one is growth from a gas or liquid phase, and the other is growth from a solid phase multi-crystal to a single-crystal. Both ways involve problems in which it is difficult to make its size large as well as form it in a complicated shape.

A crystal has atoms regularly arranged in a three dimensional configuration therein, having three axes a, b, and c, three axial angles alpha, beta, and gamma intersecting them, and an axial ratio of the relative lengths of the axes.

The atoms or molecules configuring the crystal have a chemically bonding force therebetween. There are some types of chemically bonding, including ionic bond, shared bond, metallic bond, and van der Waal's bond, which are different in their natures. With the existence of a chemically bonding force, the atoms or molecules can be regularly configured to a lattice to form a crystal. Every crystal has a particular crystal structure according to the crystal system.

The crystal has a nature called orientation that clearly distinguishes it from other liquids and non-crystals. It has anisotropy in its physical nature in a direction parallel with an axis which is different from that of the perpendicular direction. It was impossible to chemically bond such crystals having a crystal structure and anisotrophy so that they integrate and assimilate together.

A prior art optical filter, such as a spectrum transmission or an absorption filter, usually called a color filter, is made up of non-crystalline optical glass with color impurities added to transmit or absorb a specific spectrum or spectra.

There also is a prior art gelatin filter that is formed as follows. A gelatin solution has dyes mixed. The mixed gelatin solution is poured onto a glass plate to form a uniform film. The gelatin film is held on both sides by glass plates to protect it.

There is also a prior art filter of non-crystalline transparent quartz glass (melted crystal) which provides more heat resistance and durability than optical glass. There, however, have been no transmission or absorption filters of quartz glass used as color filters. Only a filter of black quartz glass (melted quartz) that can be called the color filter, but it is for light screen, not for a light transmission or absorption.

In view of its chemical property, transparent quartz glass provides higher transparency than optical glass, and it can be easily processed. It, therefore, is widely used in place of optical glass where transparency is needed, particularly as the analytic cell of a photometer which needs a wide range of light transparency as light transmission material.

A special cell includes a black cell for light diffraction and screening which needs no slit plates. It is processed as follows. Two sheets of transparent quartz glass plate have a single concave bracket of opaque black quartz glass inserted therebetween as a frame of light refraction and screening, which has a large amount of impurities mixed. The sheets and bracket are melted together.

In a physical view, the prior art light emitting device has been made up of a tin film of a single-crystal which has little defects and contains very few impurities. It can emit light with a voltage applied across the thin film to excite it. It is fabricated in a way of a single-crystal being heated and evaporated to a different kind of substrate single-crystal in an ultra-high vacuum environment to stick a fog of minute crystal grains to the substrate. The prior art light receiving device also is fabricated in the same way.

The prior art light path and the light integrated circuit is made up of different kinds of non-crystal glass. The difference in properties is used as a difference of diffractions to enter the light to the light path to transmit. The following paragraphs describe the method in which prior art techniques mentioned above are applied to the laser.

It is often that a solid laser oscillating device is produced in the following way. A material 3 to 10 mm diameter and 30 to 150 mm long is usually ground and polished to have parallel, flat ends with their parallelism less than 10 seconds and a flatness less than one tenth of a light wavelength equal to 6328 angstroms or to a precise sphere. The polished surface(s) have a reflection film evaporated directly to form a resonator. It is most often that excitation is made with a strong light irradiation of a xenon flash lamp.

The solid laser oscillating device is usually made up of a cell of a tube (discharge tube) 1 to 10 mm diameter and 100 to 2,000 mm long filled with a gas and a refection mirror arranged at each ends. In this construction, it is excited by a discharge to oscillate and emit light. There are two types of solid laser oscillating devices: an internal resonation type having reflection mirrors sealed in the laser tube and an external resonation type in which they are provided outside. The material is generally of transparent quartz glass. The excimerlaser uses a gas filled cell which has an optical crystal for light transmission windows.

The liquid laser, like the gas laser, uses a cell filled with a solution in place of the gas. It is excited by irradiation from a strong light of an xenon lamp. Its properties are similar to those of the solid laser.

In an optical view point, the optical glass spectrum color filter and gelatin filter and quartz glass (melted crystal and quartz) cell are all of a non-crystal. It is easy to have the optical glass colored and to form the cell of quartz glass. They however are limited in use in connection to heat resistance, freezing resistance, pressure resistance, chemical resistance, and durability. The heat resistance of optical glass, for example, is below 500° C., and gelatin filter tends to age too much.

Also, from a chemical view point, the cell of quartz glass is so weak to chemicals that its surfaces is instantly corroded by a hydrofluoric acid.

Though the prior art devices mentioned above are involved in optical and chemical difficulties and are limited in application as discussed above, they are inevitably employed in the present situation.

Further, from a physical view point, there is a process in which thin film is made to grow on a substrate of crystal to form single-crystal light emitting and receiving devices. In the process, very minute grains of crystal are evaporated on the crystal substrate. The process is involved in the unavoidable difficulty that there exist non-uniform defects of holes or grain boundaries caused in the melting stage. This results from imperfect physical contact of the grains before growth. It therefore can be regarded as likely impossible to produce perfectly uniform growth of a thin film having no holes as long as it is formed by evaporation.

As for the light path and light integrated circuit, these are made up of a set of different kinds of glass. They become unstable because of their different expansions or contractions due to temperature change.

The solid laser oscillating device has become larger in application and finer in partial sections. It, however, is limited in the growth process of a single-crystal.

Also, a solid laser oscillating device is limited in oscillation efficiency which can be made higher in proportion to ratio of the length of the device to the diameter. In order to make the oscillation efficiency higher, in other words, it has to be made longer. It thus may be bent by its own weight so that the parallelism of the both ends cannot be maintained, resulting in stopping oscillation.

Prior art gas laser oscillating devices are divided into two types: one is of lower pressure of the mixed gas filling in the cell, and the other is of higher pressure. The light transmission window material used for light emission is transparent quartz glass or optical crystal.

As transparent quartz glass is a non-crystal, the light transmission windows and the cell can be melted together. As the optical crystal is not a non-crystal, they cannot be melted together; the light transmission windows are coupled with the cell by pacing to seal the gas in. Particularly for an exima-laser, quartz glass cannot be used for the light transmission windows as it is instantly corroded by a fluorine-mixed gas filling it. In place of the quartz glass, magnesium fluoride ($MgF_2$) or calcium fluoride ($CaF_2$) which is an optical crystal has to be used. The pressure however cannot e high to press the packing because the light transmission windows are distorted.

Also, it is difficult to make it cool due to heat radiation from excitation and to sue the method of packing for sealing in a severe environment.

The liquid laser is excited by irradiation from a strong light. There is a problem with the durability of a prior art solution cell during excitation.

In view of the foregoing, it is a general object of this invention to provide a process that forms a single-crystal devices of synthetic corundum or synthetic spinel which are very much stable in optical, chemical, and physical view points and that is easily available to form complicated shapes.

BRIEF DESCRIPTION OF THE INVENTION

An object of the present invention is to solve the problem mentioned above to easily form a single-crystal unit of a desired shape.

The other object of this invention is to provide a process wherein a plurality of synthetic single-crystals having an identical prime component and crystal system are shaped with the identical axis, identical axial angle, and identical axial ratio, and are optically polished, optically bonded, and uniformly heated to chemically bond and integrate them together.

There are two methods of heating: one is heating synthetic single-crystals up to a predetermined temperature and keeping them at the temperature until the end of heating, and the other is repeatedly heating them up and gradually cooling them down within a highest temperature which is lower than a transition point thereof, and they are repeatedly heated up and gradually cooled down again within a highest temperature which is higher than the transition point, and that these process steps are continued until the highest temperature reaches the predetermined temperature.

As described above, the process of the present invention can produce a large, complicated precise shape of a synthetic single-crystal unit as it is a method in which a plurality of synthetic single-crystals can be bonded and integrate and assimilate together without damaging the crystal structure of the already-grown synthetic single-crystals.

Therefore, it is available in the optical, chemical, and physical fields.

Another object of this invention is to provide a process in which plurality of colorless synthetic single-crystals T or colored ones 11 through 17 (FIG. 4) having the same prime component and no color impurities contained therein are optically polished on both parallel ends thereof which intersect at a particular crystal axis with a particular angle, and in which the polished optical end faces are optically bonded with the identical axis, identical axial angle, and identical axial ratio, and that all parts are uniformly heated to chemically combine and integrate together.

Still another object of this invention is to provide a spectrum transmission or absorption filter formed by synthetic single-crystals of color tones associated with particular spectra selected from among the above-mentioned synthetic crystals 11 through 17 containing color impurities laid one over another in an order of the spectrum.

Further, the process of the present invention provides that red, yellow, and blue synthetic single-crystals 11, 13, and 15 selected from among the above-mentioned spectrum transmission or absorption filters made of synthetic single-crystals 11 through 17 containing color impurities, and that the three primary colors are adjustably mixed to obtain a desired color tone.

Furthermore, the process of the present invention provides that a colorless synthetic single-crystal T or colored ones 11 through 17 containing impurities is made of synthetic corundum or synthetic spinel.

As described above, the advantages of the present invention are achieved through the selection of single-crystals of the same major component and crystal system from among those having superior heat resistance, chemical resistance, pressure resistance, and freezing resistance in optical, chemical, and physical view points. The selected single-crystals can be chemically combined together into a structure on the parallel faces thereof intersecting a particular crystal axis at a particular angle with the identical axis, axial angle, and axial ratio. The structure therefore can be formed to a precisely complicated shape.

The above and other objects, advantages and novel features of this invention will be more fully understood from the following detailed description and the accompanying drawings, in which like reference numbers indicate like or similar parts through wherein;

DETAILED DESCRIPTION OF THE INVENTION

The process according to an embodiment of the present invention is to obtain a bonded crystal unit of identical axes without the use of any bonding agent and solvent. This can be achieved in such a way that the sides of the synthetic single-crystals facing each other are shaped and treated so as to have identical axes, axial angles, and axial ratio, and that are optically polished. The polished sides are combined to integrate together which means optically bonded with identical axes, axial angles, and axial ratio, and that the entire bonded unit is uniformly heated to make unstable interfacial sides bonded optically to cause an interfacial reaction, and is gradually cooled down to make it stable for chemical bonding. This process will not damage the crystal structure.

It can be considered that in the fabrication process, the configuration of the surface layers of the bonded synthetic single-crystal unit are much disordered or made to differ from that of the inside being subjected to considerably stronger fine impact or damage by the optical polishing and treating step.

The surface layers have the bonding cut out and are strongly affected with the remaining of the "bonding arms". The affect reaches a number of the surface layers, which have an atomic configuration considerably distorted from the crystal structure of the inside. The atomic configuration will change differently with temperature rise so that such a state is very much unstable.

The atoms on the polished surface layers have "bonding arms" still remaining which can bond with others. In the surface layers, thus, interfacial reaction tends to easily occur. If the temperature is raised up so that the entire unit can be made uniform, optically bonded interfacial sides of the synthetic single-crystals are made active to cause interfacial reaction. The atoms and molecules of the surface layers will chemically bond with one another with gradual cooling. This is due to the fact that they tend to fall to a lower free energy state and become stable with crystallization rather than in the separate state of atoms and molecules. The surface layers, that is, integrate and assimilate together to become a single-crystal unit of identical axes.

The following paragraphs describe experiment examples.

EXPERIMENT EXAMPLE 1

In this experiment, from among synthetic single-crystals of identical major component and crystal system a quartz crystal was selected, the crystal system of which belong to the hexagonal system and the major component of which is $SiO_2$.

The axis names are usually referred to as the x, y, and z axes. To avoid possible confusion and to clarify the description, however, the z, x, and y axes are replaced by c, a, and b, respectively. It should be noted that the c, a, and b axes will not necessarily coincide with crystal axes c (z), a (x), and b (y) of the crystal structure according to the crystal system.

Figure 1:
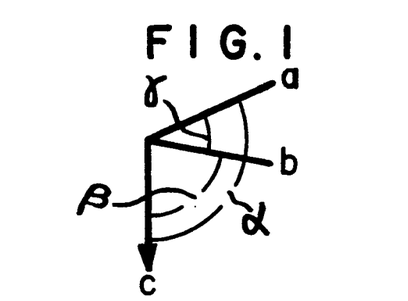
FIG. 1 is an illustration showing particular crystal axes c, a, and b.

FIG. 1 is an illustration showing particular crystal axes c, a, and b which are axial references for the process steps shown in FIG. 1, and particular axial angles alpha, beta, and gamma.

Figure 2:
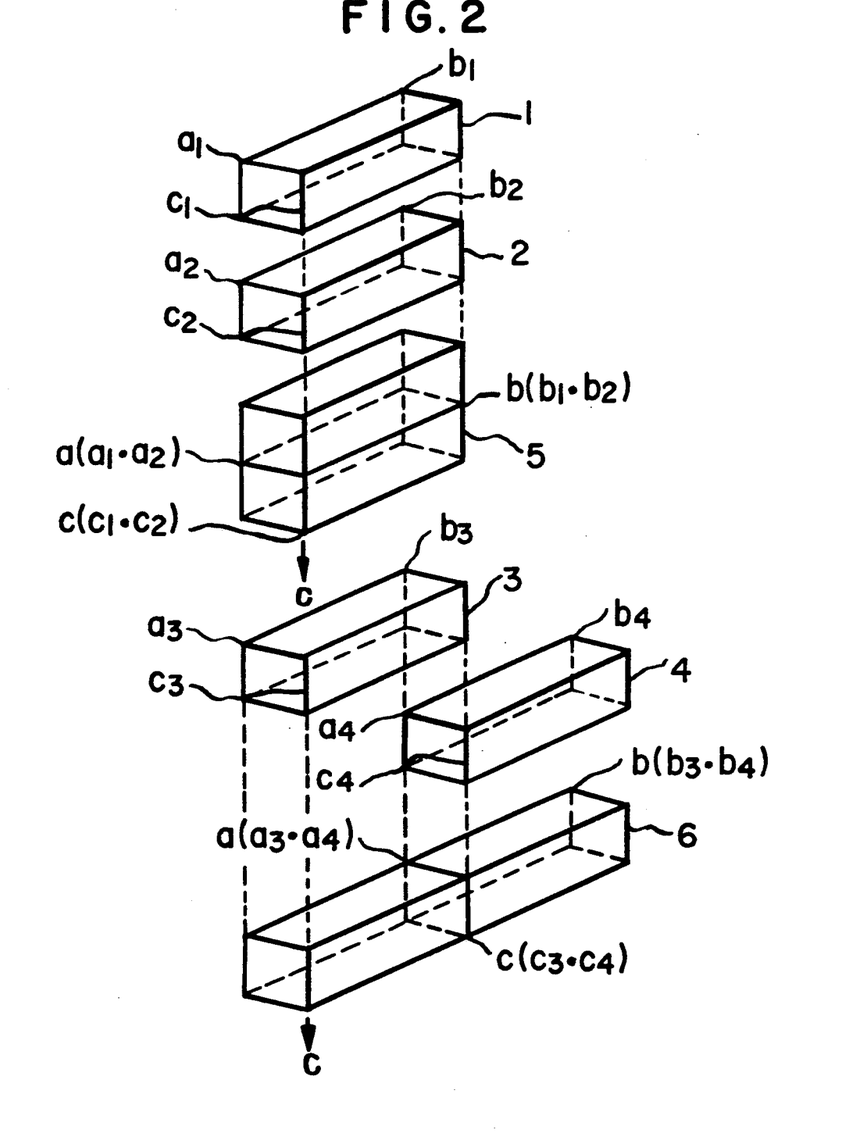
FIG. 2 shows a bonding process for single-crystals.

FIG. 2 shows a bonding process for the single-crystals. The bulk of the quartz single-crystal was shaped to rectangular pillars 1, 2, 3, and 4 of identical axes, axial angles, and axial ratio according to the reference axes with use of an X-ray analysis apparatus. The shaped rectangular pillars were optically polished precisely on the necessary sides to accuracies of flatness of better than one eight of a wavelength of 6328 angstroms and parallelism and squareness of less than 5 seconds. It should be noted that rectangular pillars 1, 2, 3, and 4 need not necessarily be of the same shape. Rectangular pillars 1 and 2 were placed one on the other with their crystal axes $c_1$ and $c_2$ made to coincide and with axes $a_1$ and $a_2$ and $b_1$ and $b_2$ made parallel, with the optically polished sides being interfaced. They then were optically bonded to a unit referred to as parallel rectangular pillar 5 with the identical crystal axes c ($c_1$, $c_2$), a ($a_1$, $a_2$), and b ($b_1$, $b_2$) and the identical axial ratio.

Rectangular pillars 3 and 4 were connected in series with their crystal axes $c_3$ and $c_4$ made to coincide and with axes $a_3$ and $a_4$ and $b_3$ and $b_4$ made parallel, with the optically polished sides being interfaced. They then were optically bonded to a unit referred to as serial rectangular pillar 6 with identical crystal axes c ($c_3$, $c_4$), a ($a_3$, $a_4$), and b ($b_3$, $b_4$) and the identical axial ratio.

Figure 2A:
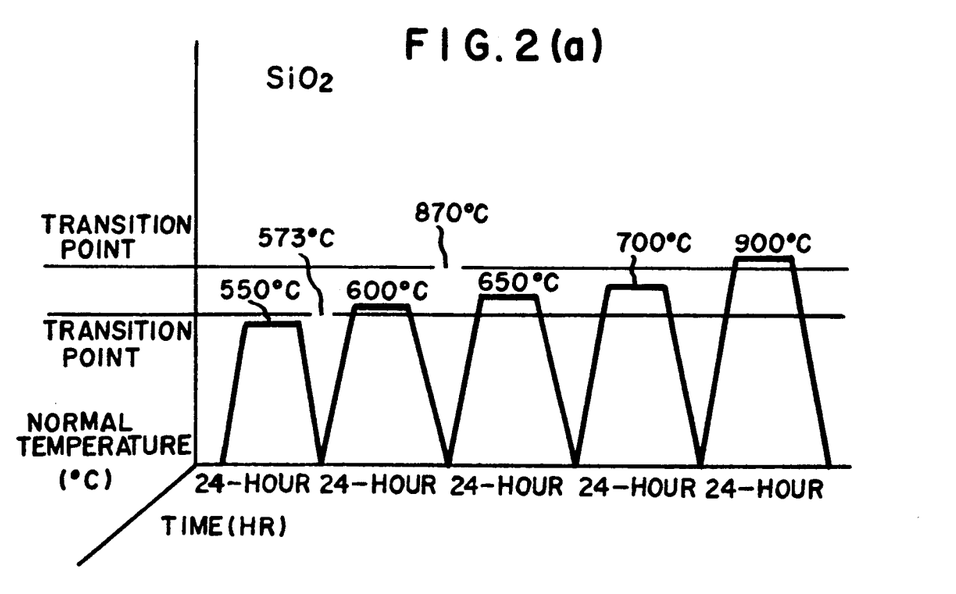
FIG. 2a shows a graph of heating process for a single crystal in the case of quartz crystal.
Figure 2B:
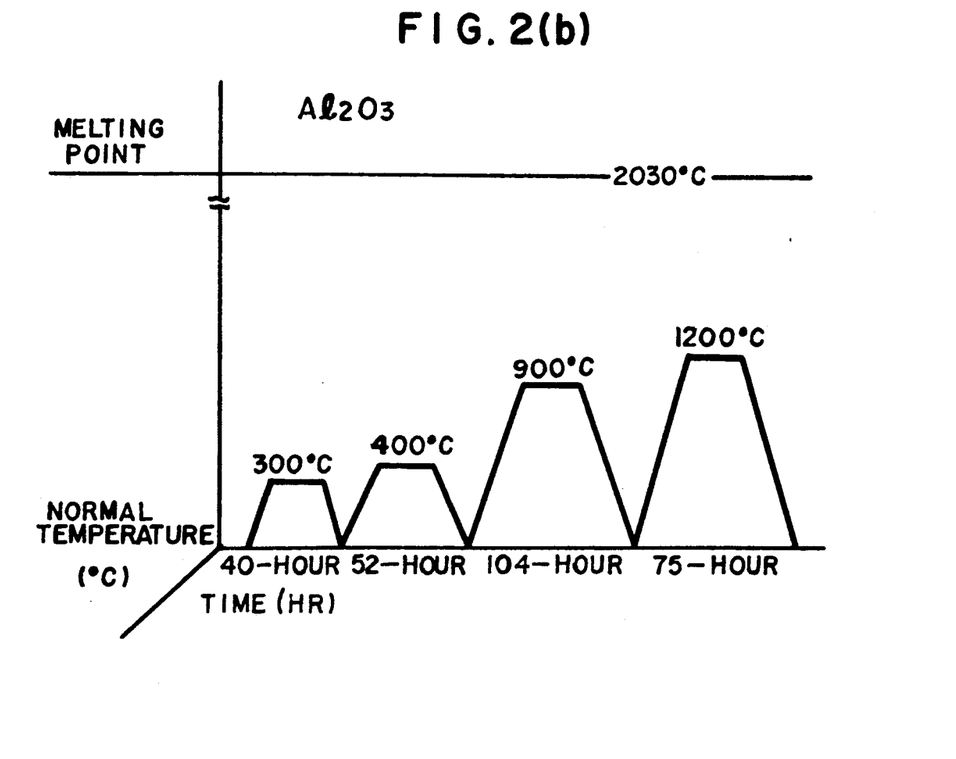
FIG. 2b shows a graph of heating process for a single crystal in the case of sapphire crystal.

After optical bonding, the entire units were repeatedly heated up uniformly and gradually cooled down within a highest temperature which was lower than a transition point thereof and thereafter were kept at a temperature within the highest temperature higher than the transition point. More specifically, as shown in FIG. 2a, they were repeatedly heated up to 550° C. and gradually cooled down to the room temperature, then heated up to 600° C., 650° C., 700° C. over the transition point 573° C. from α quartz crystal to β quartz crystal, and gradually cooled down to the room temperature respectively. Then heated up to 900° C. over the transition point 870° C. from β quart crystal to crystalite (or tridymite) and cooled down to the room temperature. However, strange to say, said exfoliation or fracture does not occur. FIG. 2b shows a graph of heating process of the the single crystal in the case of sapphire, in which they are heated up to 300° C., 400° C., 900° C., 1200° C. below the melting point 2030° C. respectively and cooled down to the room temperature. This process can avoid the usual unavoidable change of the system itself and can obtain identical axis bonded quartz crystal units with parallel rectangular pillar 5 and the serial rectangular pillar 6 of larger size and superior grown shape.

EXPERIMENT EXAMPLE 2

In this experiment, from among synthetic single-crystals of an identical major component and crystal system was selected a synthetic corundum (sapphire) and crystal system of which belongs to the hexagonal system and the major component of which is $Al_2O_3$.

Figures 3, 5:
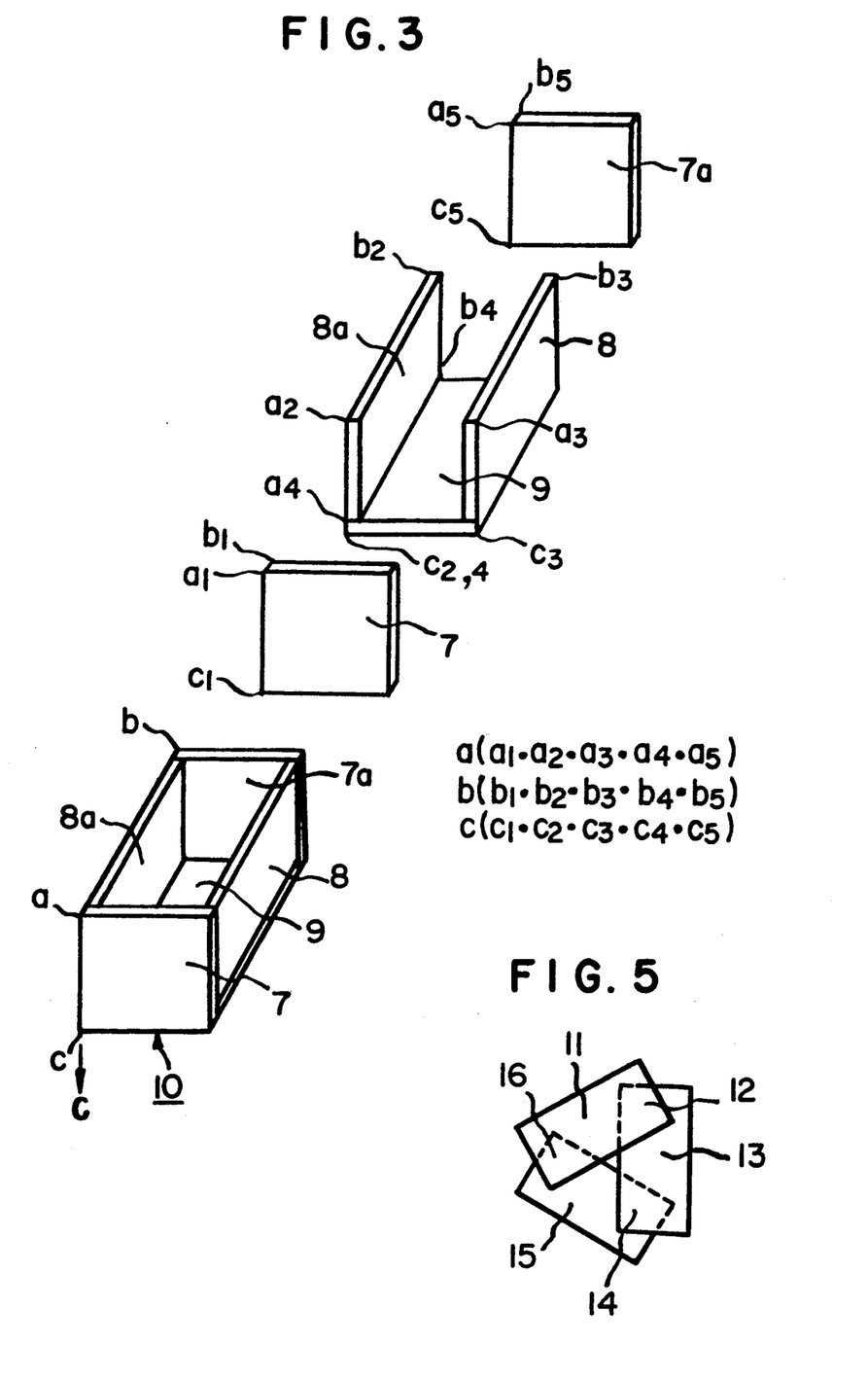
FIG. 3 is an illustration showing a fabrication process for a single-crystal vessel.
FIG. 5 is an illustration of mixing the colors of synthetic corundum single-crystal plate pieces 11 through 16.

FIG. 3 illustrates a fabrication process for a single-crystal vessel taken as an example of new complicated and precisely shaped synthetic single-crystal units. The single-crystal bulk of the sapphire was shaped and treated to produce single-crystal plates of identical axes, axial angles, and axial ratio according to the reference axes using of an X-ray analysis apparatus. The necessary sides of the shaped plates were optically polished to high accuracies as in the Experiment of Example 1. A surface plate 7 with crystal axis $c_1$ and axes $a_1$ and $b_1$ assigned, a left-hand side plate 8a with crystal axis $c_2$ and axes $a_2$ and $b_2$, a right-hand side plate 8 opposite to it with crystal axis $c_3$ and axes $a_3$ and $b_3$, a bottom plate 9 with crystal axis $c_4$ and axes $a_4$ and $b_4$, and a surface plate 7a opposite to surface plate 7 crystal axis $c_5$ and axes $a_5$ and $b_5$ are provided. Surface plate 7, left-hand side plate 8a, right-hand side plate 8, bottom plate 9, and surface plate 7a were assembled to form a box.

The crystal axis c and the axes a and b of all the plates were arranged so that they could coincide with the reference axes shown in FIG. 1. Interfacial sides of the plates were optically polished and bonded. The entire unit was uniformly heated to 1,200° C. continuously, for sapphire, which is lower than its melting point of 2,030° C., or repeatedly heated up and gradually cooled down as described previously. This causes an interfacial reaction on the optically bonded interfacial sides and causes a chemical bonding with the gradual cooling. These integrate and assimilate the plates together to form a sapphire vessel 10 of identical axis bonded crystal.

In the experiment examples described above, an synthetic single-crystals of identical major component and crystal system, the materials selected were a quartz crystal having a transition point of high and low temperatures and a sapphire which is high in the melting point and hardness.

It is to be understood that the form of the present invention herewith shown and described is to be taken as preferred embodiments. Various changes may be made in the shape, size and arrangement of parts. For example, equivalent elements may be substituted for those illustrated and described herein, parts may be reversed, and certain features of the invention may be utilized independently of the use of other features, all without departing from the spirit of scope of the invention as defined in the subjoined claims.

While the principles of the invention have been described above in connection with specific embodiments, and particular modifications thereof, it is to be clearly understood that this description is made only by way of example and not as a limitation on the scope of invention.

As for prior art processing techniques of synthetic single-crystals, they include cutting, grinding, polishing, and boring processes of the materials formed in a gas phase, liquid phase, or solid phase.

The synthetic single-crystals provide a higher optical transmissivity than non-crystals. They also provide a wider range of wavelength from infrared to ultraviolet region than the non-crystals. They further have particular features of a crystal structure. Thus, the synthetic single-crystals have been used in a wide variety of applications, for example, for polarizing and optical rotating devices.

From a physical view point, synthetic single-crystals can endure high and low temperatures and quick heating and cooling as they have high melting points. Their hardness is incomparably higher than the non-crystals.

From a chemical view point, the synthetic single-crystals provide superior chemical resistance so that they are free of corrosion and chemically stable.

In any of the respects mentioned above, the synthetic single-crystals provide features superior to non-crystals. They, however, are disadvantageous in that they are so hard and are not easily dissolved so that processing them is difficult.

In addition, the greatest defect of synthetic single-crystals is that unlike non-crystals, they cannot be melted together.

The process of the present invention can make synthetic single-crystals join together like non-crystals. In optical, chemical, and physical fields of application, therefore, it can obtain new synthetic single-crystal units of larger or smaller complicated precise shapes.

Synthetic single-crystals in a second embodiment of the present invention were a synthetic corundum and a synthetic spinel. In the following description, the synthetic corundum was taken as an example. This means that the synthetic spinel can also be embodied in a similar way.

Figure 4:
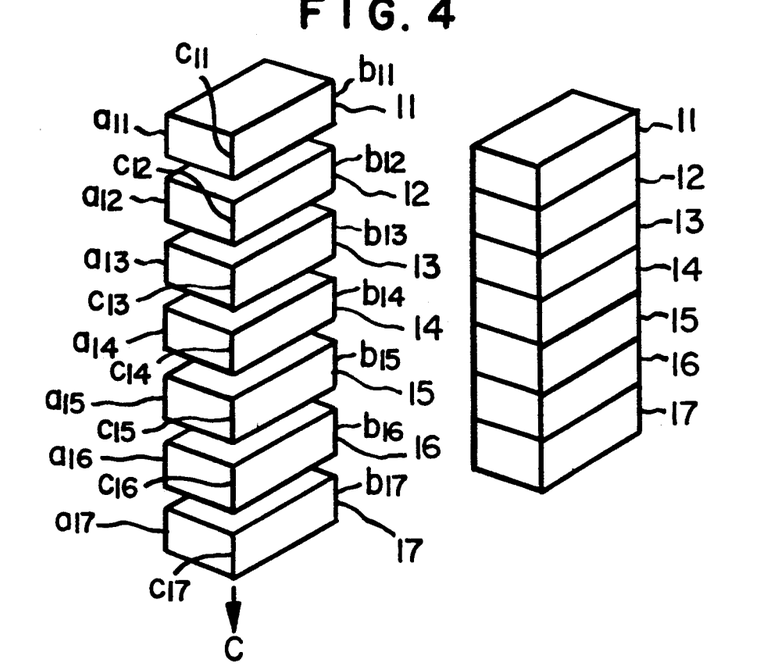
FIG. 4 is a schematic representation of an integrating and assimilating process for synthetic corundum single-crystal plate pieces the major component of which is $Al_2O_3$ integrated and assimilated together.

The major component of synthetic corundum is $Al_2O_3$. There are color impurities as shown in Table 1. The color impurities needed for and used in the embodiment are single crystals T and 11 through 17 (FIG. 4).

TABLE 1

| NAME | SINGLE CRYSTAL | COLOR | AMOUNT OF COLOR IMPURITIES ADDED, % |
|---|---|---|---|
| White sapphire | T | None | None. |
| Light pink sapphire | C | Light pink | $Cr_2O_3$: 0.01–0.05. |
| Pink ruby | P | Pink | $Cr_2O_3$: 0.1–0.2. |
| Ruby | 11 | Red | $Cr_2O_3$: 2.0–3.0. |
| Damberite | 12 | Orange | NiO: 0.5. $Cr_2O_3$: 0.2–0.5. |
| Yellow sapphire | 13 | Yellow | NiO: 0.5–1.0. |
| Green sapphire | 14 | Green | |
| Blue sapphire | 15 | Blue | $TiO_2$:0.5. $Fe_3O_4$: 1.5. |
| Alexandrite | 16 | Bluish violet (in sun-shine) Reddish violet (in electric light) | $V_2O_5$. 3.0~4.0 |
| Violet sapphire | 17 | Violet | $TiO_2$: 0.5. $Fe_3O_4$: 1.5 $Cr_2O_3$: 0.1. |
| Topaz | G | Gold | NiO: 0.5. $Cr_2O_3$: 0.01–0.05. |
| Star ruby | R | Opaque Red | $Cr_2O_3$: 1.0–2.0. $TiO_2$: 0.1–0.3. |
| Star sapphire | B | Opaque Blue | $Fe_3O_4$: 1.5. $TiO_2$: 0.1–0.3. |

Red Note: The table is for a synthetic corundum having as a major component $Al_2O_3$.

The present invention uses a combination of a colorless synthetic corundum and a colored synthetic corundum.

First, a synthetic corundum single crystal integration and assimilation is made by a process comprising cutting a synthetic corundum single-crystal ingot(s) into plate pieces at planes in parallel with a plane thereof crossing a particular crystallographic axis thereof at a particular angel, optically polishing both parallel plane faces of each cut plate piece, placing the polished plate pieces one on another with their plane, edges, axes and axial angles of upper and lower optically-polished faces aligned with each other, respectively, bringing them into optical bonding with each other, and uniformly heating the whole body to cause an interfacial reaction at the contact surfaces of every single-crystal plate pieces which is called chemical bonding.

This paragraph explains some difference between crystal and non-crystal. A crystal is an anistropy solid body, while a non-crystal is a non-anisotropic solid body of glass quality. A single crystal of synthetic corundum (Sapphire), as an example, has a coefficient of linear expansion of $0.67 \times 10^{-5}$ per degree at 50° C. in parallel with axis c thereof, and that of $0.50 \times 10^{-5}$ per degree at 50° C. at right angles to axis c. The parallel and perpendicular coefficients, that is, are different to a great extent.

A spectrum color filter of optical glass has a heat resisting temperature (softening point) of 500° C. or lower at maximum. It therefore cannot be used for such a unit as a maneuvering apparatus of a flying body subjected to abrupt temperature changes, including a sudden temperature rise and fall. Synthetic corundum provides more incomparable advantages than an optical color filter as it has a heat resisting temperature (melting point) of 2,030° C. or lower, provides a heat resistance approximately four times that of the optical color filter at a maximum continuous operating temperature, provides a Mohs' hardness of 9 while that of the optical color filter is as flow as 6, and is free of trouble due to aging.

For these reasons, like non-crystals, single crystals 11 through 17 of synthetic corundums mentioned in Table 1 can be processed by the method according to the present invention as follows. The single crystals are cut to a shape with identical axis, axial angle, and axial ratio. The cut surfaces to be combined are optically polished precisely to a parallelism below one eight of a wavelength equal to 6328 angstroms and a flatness less than 10 seconds. The color tones are arranged in order of spectra or any order. The optically polished surfaces are placed and chemically combined one on the other to coincide with the identical axis, axial angle, and axial ratio to integrate and assimilate together.

In order to obtain a desired special spectrum color tone, the integration and assimilation process is produced as follows. From among the colored single-crystals of synthetic corundums are selected three primary color ones 11, 13, and 15 given in Table 1, including the ruby (red), yellow sapphire, and blue sapphire. They are shaped into sheets. Color mixing is adjusted properly to the desired color tone. The two sheets of yellow sapphire and blue sapphire, for example, are placed one on the other in view of color tone, and are mixed in the integration and assimilation process. The resulting mixed color is green. It should be noted that the green color is not the unique single color of the green sapphire.

The resulting color is dark with the number of colors mixed increased as subtraction mixing. Such a fact is used to form a transmission or absorption filter which allows light in a narrow range of wavelengths. It is possible, for example, to fabricate an ultraviolet and infrared transmission and absorption filter. It is also possible to make up a color temperature conversion filter and three-primary color decomposition filter.

Also, single-crystals 11 through 17 of synthetic corundums given in Table 1 are used as materials to form an analytical cell of a photometer as follows. They are selected and combined according to desired spectra, and are optically polished. The polished surfaces are chemically combined with the identical axes, axial angles, and axial ratios made to coincide and to integrate and assimilate together. In this case, a cell serving both for light transmission and absorption can be made up as follows. One light absorption concave fame is formed of a material of a desired color tone processed in the same way as the light transmission windows. This allows light to be transmitted in one direction and to be absorbed in the other direction.

Further, a light emitting or receiving device of a non-porous thin film can be made up of a thin film growth of single-crystal, unlike the usual evaporation method, as follows. From among synthetic corundum single-crystals 11 through 17 given in Table 1 are selected one single-crystal suitable to the light emitting or receiving device and a substrate suitable to it. The light emitting or receiving device is placed on and chemically combined with the substrate in the integration and assimilation process mentioned above. Only the light emitting or receiving device on the substrate is ground to a desired thickness.

Further more, as for the light paths and light integrated circuit, these are made up as follows. From among synthetic corundum single-crystals 11 through 17 given in Table 1 are selected one single-crystal suitable to the light path and the other one suitable to the substrate. The selected single-crystals are chemically combined together in the integration and assimilation process. Only the light path is ground to a desired thickness to complete a single light path. A number of the completed light paths are laid one on another and chemically combined in the integration and assimilation process to complete the light integrated circuit.

The solid laser oscillating device can be improved in the oscillation efficiency in such a way that its length is made long with the diameter kept as it was.

In the process according to the present invention, a core is made of a single-crystal suitable to the solid laser oscillating device selected in connection with a desired range of wavelengths from among the synthetic corundum single-crystals 11 through 17 given in Table 1, and a clad is made of a single-crystal selected to be suitable to the the range of wavelengths mentioned above in connection with high light transmission. With the core covered with the clad, the solid laser oscillating device cannot be bent by its own weight irrespective of the ratio of length to diameter. This means that a highly efficient solid laser oscillating device can be achieved. It is also possible to form a longer solid laser oscillating device in such a way that a plurality of the devices are connected and chemically combined in series at their ends to integrate and assimilate together.

Prior art gas laser oscillating devices are fabricated as follows. The mixed gas for an excimer-laser will corrode the non-crystal glass as it is mixed with hydrogen fluoride. To prevent this, a light transmission window of magnesium fluoride ($MgF_2$) or calcium fluoride ($CaF_2$) is nipped by packing and fastened to a flange-equipped cell by a ring. The fastening may cause distortion in the light transmission window.

The process according to the present invention can achieve a high power ultraviolet gas exima-laser oscillating device in such a way that a single-crystal suitable to a desired wavelength is selected from among synthetic single-crystals, and the light transmission windows and cell body are integrated together in the integration and assimilation process.

The present invention is further illustrated in detail by the following nonlimitative embodiment. In the accompanying drawings, FIG. 4 is a schematic representation of an integrating and assimilating process having synthetic corundum single-crystal plate pieces the major component of which is $Al_2O_3$ that are integrated and assimilated together. The left-hand seven single-crystal plate pieces correspond to single-crystals 11 through 17 given in Table 1. The single-crystals 11 through 17 are shaped and processed into plate pieces with the identical axis, identical axial angle, and identical axial ratio using an X-ray diffraction apparatus. Both faces of each single-crystal plate pieces are optically polished to a high degree of precision, that is, to a flatness of one eight of the wavelength of 6328 Angstroms or less and a parallelism of 5 seconds or less. The single-crystal plate pieces are plased together along an axis C as shown in the right-hand figure of FIG. 4, with crystal axes $c_{11}$, $c_{12}$, $c_{13}$, $c_{14}$, $c_{15}$, $c_{16}$, and $c_{17}$ thereof being on the identical axis, with axials $a_{11}$, $a_{12}$, $a_{13}$, $a_{14}$, $a_{15}$, $a_{16}$, and $a_{17}$ thereof being equal, and with axials $b_{11}$, $b_{12}$, $b_{13}$, $b_{14}$, $b_{15}$, $b_{16}$, and $b_{17}$ thereof being equal. They then are optically bonded. It should be noted that the crystal axes, the axial angles, and the axial coefficients mentioned above need not always coincide with the crystal axes, axial angles, and axial coefficients of the crystal structure. The whole body of single-crystal plate pieces laid one over another is uniformly heated to 2,030° C. or a lower temperature, or actually to around 1,200° C., to make an interfacial reaction on the combined faces to chemically combine them together. Single-crystal plate pieces 11 through 17, that is, are laid one over another in an order of spectra to integrate and assimilate to a spectrum transmission and absorption filter.

FIG. 5 illustrates mixing the colors of synthetic corundum single-crystal plate pieces 11 through 17. Three single-crystal plate pieces 11, 13, and 15, including the ruby (red), the yellow sapphire, and the blue sapphire, are selected and arranged to form a rectangle to mix the three primary colors to obtain a desired spectra. In the figure, single-crystal plate pieces 11 and 13 are laid one over the other to correspond to orange damberite 12; single-crystal plate pieces 13 and 15 are laid one over the other to correspond to green sapphire 14; and, single-crystal plate pieces 11 and 15 are laid one over the other to correspond to blue-violet (in the sunshine) or red-violet (in an electric light) alexandrite 16. Such combinations provides a spectrum transmission and absorption filter of desired color tones.

Figure 6A:
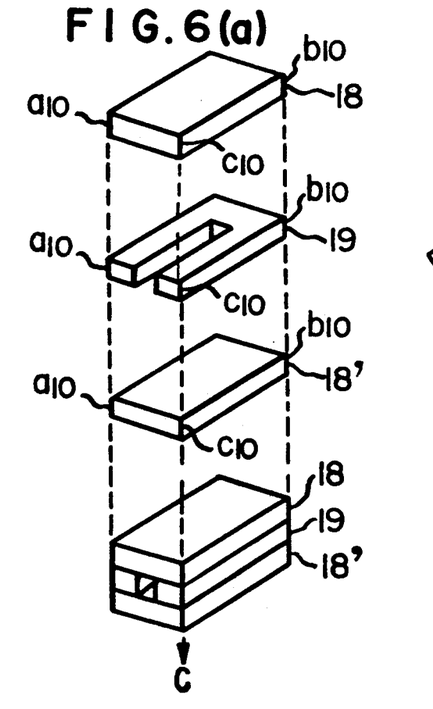
FIG. 6a is an illustration of a process for producing a spectrum transmission and absorption cell.
Figure 6B:
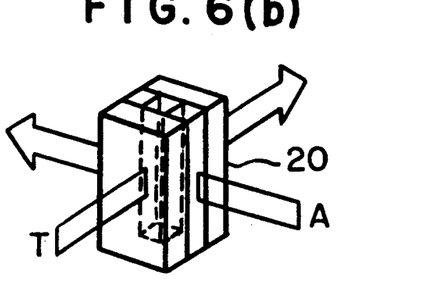
FIG. 6b is an illustration of the characteristics thereof.

FIG. 6a is an illustration of a process for producing a spectrum transmission and absorption cell; and, FIG. 6b is an illustration of the characteristics thereof. Two kinds of synthetic corundum single-crystals are selected which are necessary for the transmission and absorption. Each of these is formed into plate pieces with an identical axis, identical axial angle, and identical axial ratio. Two single-crystal plate pieces of one kind are optically polished on both surfaces thereof as light transmission window plate pieces 18 and 18'. The other kind is used as an optically light absorbing window plate piece 19 which can absorb specific light. Light absorbing window plate piece 19 has a cutout at a center thereof to form a U-like shape, and is optically polished on both upper and lower sides thereof and on the inside surfaces of the cutout. Light absorbing window plate piece 19 is inserted between light transmission window plate pieces 18 and 18'. These are laid one over another with their axes $a_{10}$ and $b_{10}$ and axis $c_{10}$ aligned, and are chemically combined to integrate and assimilate together to form cell 20.

Cell 20, as shown in FIG. 6b, can be used as a light transmission cell is light comes from a direction T; and, it can be used as a light absorption cell if light comes from a direction A. In other words, it can serve as a cell both for spectrum transmission and absorption.

Figure 7:
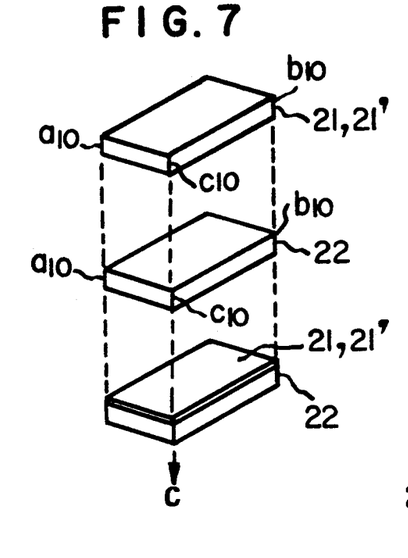
FIG. 7 is an illustration for forming a light emitting device or a light receiving device.

FIG. 7 illustrates forming light emitting device 21 or light receiving device 21'. This can be formed in the following way. From among single-crystal plate pieces 11 through 17 is selected a proper one having a wavelength for light emission and another proper one for substrate 22. These are formed into plates that can be identical in axis, axial angle, and axial ratio. They then are optically polished and placed one over other. They are chemically combined to integrate and assimilate together. After this, only light emitting device 21 or light receiving device 21 on substrate 22 is ground to the necessary thickness to complete the forming.

Figure 8:
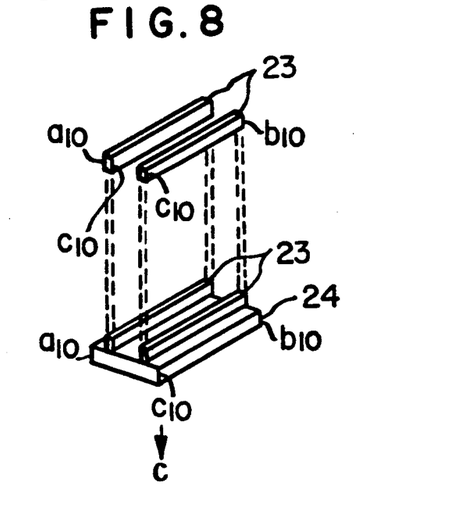
FIG. 8 is an illustration of the forming of a light Path.

FIG. 8 illustrates forming of light paths 23. These can be formed in the following way. From among the single-crystal plate pieces 11 through 17 are selected a proper pairs having wavelength for light paths and another proper one for substrate 24. These are formed into plates so that they can be identical in axis, axial angle, and axial ratio. They then are optically polished and placed one over the other. They are chemically combined to integrate and assimilate together. After this, only light paths 23 on substrate 24 are ground to the necessary thickness to complete the forming.

Figure 9:
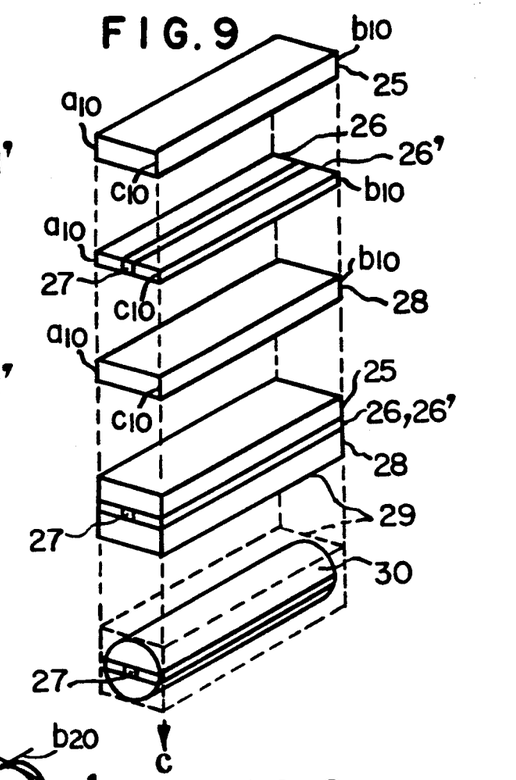
FIG. 9 is an illustration of the forming of a solid laser light emitting device.

FIG. 9 illustrates forming a solid laser light emitting device. This can be formed in the following way. From among the single-crystal plate pieces 11 through 17 is selected a proper one having a wavelength for laser light emission, another proper one for core 27, and a proper pair for clads 26 and 26' which can transmit light. Core 27 is held and chemically combined to integrate and assimilate between clads 26 and 26' to form an intermediate layer. The intermediated layer is held between top plate 25 and bottom plate 28 which are of the same single-crystal as clads 26 and 26'. These are aligned one over another in axis, axial angle, and axial ratio, and are chemically combined to integrate and assimilate together to form rectangular pillar 29. Rectangular pillar 29 is shaped into a cylindrical pillar. Both ends of the cylindrical pillar are optically polished precisely to a flatness greater than one tenth of the wavelength (=,<6328 angstroms) and to a parallelism greater than 20 seconds. The surface of the cylindrical pillar also is optically polished. This completes the solid laser light emitting device comprising clad 30 which can transmit light and core 27 which can receive and absorb light.

Figure 10:
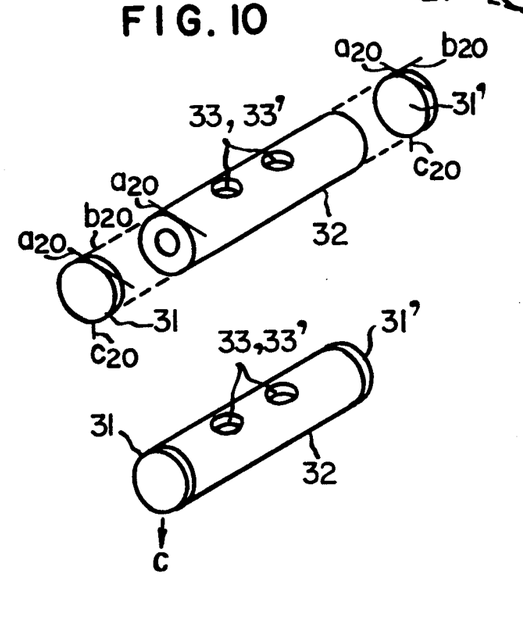
FIG. 10 is an illustration of the forming of a cell 22 for a gas laser oscillating device or a liquid laser oscillating device.

FIG. 10 illustrates forming cell 32 for a gas laser oscillating device or a liquid laser oscillating device. Cell 32 can be formed in the following way. From among the single-crystal plate pieces 11 through 17 is selected a proper one having a wavelength for light transmission windows 31 and 31'. These are optically polished precisely. For filling with a mixed gas, on the other hand, a cylinder of the same single-crystal as windows 31 and 31' is optically polished at both ends precisely. The windows 31 and 31' and the ends cylinder are accurately aligned in axis $a_{20}$, $b_{20}$, $c_{20}$, axial angle, and axial ratio, and are chemically combined to integrate and assimilate together so that the windows cover the ends of the cylinder. The cylinder has mixed gas filling ports 33 and 33' bored into the surface thereof to complete cell 32.

For a gas laser oscillating device, cell 32 is filled with a mixed gas. For a liquid laser oscillating device, it is filled with a desired liquid.

As described above, the devices formed in the process having two or more synthetic corundums or synthetic spinels (hereinafter referred to as synthetic corundum or the like) combined by an integration and assimilation method, have may advantages. From an optical view point, they provide a greater number of color tones than a variety of single-crystals of synthetic corundums or the like that are available, have greater durability, and a wider wavelength range than spectrum filters of optical glass. The synthetic corundum or the like, also, allow mixing of the three primary colors to form filters of special color tones.

From the chemical view point, it is possible to form a desired cell that can serve both for spectrum transmission and absorption in a wide range of wavelengths with high chemical resistance, by selecting a composition of single-crystals of the synthetic corundums or the like.

From a physical view point, it is possible to form a desired cell for laser oscillating devices that can be used as a cell for gases and liquids in a wide range of wavelengths, with adequate use of characteristics of the single-crystals of synthetic corundums or the like.

Also, it is possible to form a light emitting device or a light receiving device in such a way that a single-crystal non-porous thin film of a different color tone is integrated and assimilated together with a substrate of the same single-crystal made by laminating single crystals of synthetic corundum or the like. This has been difficult to do by way of evaporation.

Further, it is possible to fabricate a solid laser oscillating device by an integration and assimilation of a clad single-crystal for transmitting an exciting light with a clad single-crystal for absorbing and oscillating the light, with a wavelength able to be selected over a wide range of the single-crystals of synthetic corundums or the like.

Furthermore, it is possible to fabricate a gas laser oscillating device that is free of possible damage and distortion due to the usual clamping of light transmission window members to the cylinder. This is achieved by selecting, integrating, and assimilating a light transmission window material and a cylinder material for a high power ultraviolet excimer-laser from among single-crystals of synthetic corundums or the like.

I claim:

1. A process for producing structures by chemically bonding selected synthetic single-crystal pieces having identical major components and crystal systems comprising; shaping a plurality of synthetic single-crystal pieces to have identical prime components of crystal system axes, axial angle, and axial ratios for respective sides of said plurality synthetic single-crystals; optically polishing said respective sides of said plurality of synthetic single-crystal pieces; stacking said plurality of synthetic single-crystal pieces with said respective sides of said optically polished surface in intimate optical contact so they are optically combined; said selected synthetic single-crystal pieces containing color impurities; said synthetic single-crystal pieces being selected from synthetic single-crystal pieces having color tones associated with a particular predetermined spectra; stacking said selected synthetic single-crystal pieces to produce a filter structure having a particular predetermined spectrum of transmission or absorption; uniformly heating said stack of synthetic single-crystal pieces to a predetermined temperature; gradually cooling said stack of synthetic single-crystal pieces; said heating and gradual cooling being performed at least twice so that said stack of synthetic single-crystal pieces are integrated and assimilated together into a single-crystal unit with said respective optically contacting faces chemically bonded.

2. The process according to claim 1 in which said synthetic single-crystal pieces are selected from the group consisting of red, yellow and blue synthetic single-crystal pieces containing color impurities that have predetermined spectrum transmission and absorption filter characteristics; stacking said selected synthetic single-crystal pieces in a mixed arrangement to obtain a desired color tone.

3. A process for producing structures by chemically bonding selected synthetic single-crystal pieces having identical major components and crystal systems wherein the selected synthetic single-crystal pieces contain different color impurities, said synthetic single-crystal pieces being selected from synthetic single-crystal pieces having color tones associated with a particular predetermined spectra, the process comprising; shaping a plurality of synthetic single-crystal pieces to have identical prime components of crystal system axes, axial angles, and axial ratios for respective sides of said plurality synthetic single-crystal pieces, optically polishing said respective sides of said plurality of synthetic single-crystal pieces; stacking said plurality of synthetic single-crystal pieces with said respective sides of said optically polished surfaces in intimate optical contact so they are optically combined and to produce a filter structure having a particular predetermined spectrum of transmission or absorption; uniformly heating said stack of synthetic single-crystal pieces to a predetermined temperature; gradually cooling said stack of synthetic single-crystal pieces to ambient temperature; said heating and gradual cooling being performed at least twice so that said stack of synthetic single-crystal pieces are integrated and assimilated together into a single crystal unit with said respective optically contacting faces chemically bonded.

4. The process according to claim 3 in which said synthetic single-crystal pieces are quartz crystals; said heating comprising heating said quartz crystals to a temperature below a transition temperature at which a transition from one crystal state to another crystal state occurs; and including at least one additional heating step of heating said quartz crystals to a temperature above said transition temperature and gradually cooling said quartz crystals to ambient temperature.

5. The process according to claim 3 in which said synthetic single-crystal pieces are selected from the group consisting of red, yellow and blue synthetic single-crystal pieces containing color impurities that have predetermined spectrum transmission and absorption filter characteristics; stacking said selected synthetic single-crystal pieces in a mixed arrangement to obtain a desired color tone.

6. The process according to claim 3 in which said synthetic single-crystal pieces are selected from the group consisting of colorless synthetic single-crystal pieces and impurity containing colored synthetic single-crystal pieces.

7. The process according to claim 6 in which said synthetic single-crystal pieces are selected form the group consisting of synthetic spinel and synthetic corundum.

8. The process according to claim 3 in which said synthetic single-crystal pieces are selected from the group consisting of synthetic spinel and synthetic corundum.

9. The process according to claim 4 in which said at least one additional heating step of heating said stack of synthetic single-crystal pieces above said transition temperature comprises heating said stack of synthetic single-crystal pieces to at least 1200° C. for a period of time such that they are integrated and assimilated together.

10. A process for producing structures by chemically bonding selected synthetic single-crystal pieces having identical major components and crystal systems comprising; selecting synthetic single-crystal pieces from the group consisting of red, yellow and blue synthetic single-crystal pieces containing color impurities that have predetermined spectrum transmission and absorption filter characteristics; stacking said selected synthetic single-crystal pieces in a mixed arrangement to obtain a desired color tone; shaping said plurality of synthetic single-crystal pieces to have identical prime components of crystal system axes, axial angles and axial ratios for respective sides of said plurality synthetic single-crystal pieces; optically polishing respective sides of said plurality of synthetic single-crystal pieces; stacking said plurality of synthetic single-crystal pieces with said respective sides of said optically polished surfaces in intimate optical contact so they are optically combined; uniformly heating said stack of synthetic single-crystal pieces to a predetermined temperature; gradually cooling said stack of synthetic single-crystal pieces; said heating and gradual cooling being performed at least twice so that said stack of synthetic single-crystal pieces are integrated and assimilated together into a single-crystal unit with said respective optically contacting faces chemically bonded.

11. A process for producing structures by chemically bonding selected synthetic single-crystal pieces having identical major components and crystal systems comprising; selecting synthetic single-crystal pieces from the group consisting of colorless synthetic single-crystal pieces and impurity containing colored synthetic single-crystal pieces wherein at lest two of the selected synthetic single-crystal pieces contain different color impurities; shaping a plurality of synthetic single-crystal pieces to have identical prime components of crystal system axes, axial angles, and axial ratios for respective sides of said plurality synthetic single-crystals; optically polishing said respective sides of said plurality of synthetic single-crystal pieces; stacking said plurality of synthetic single-crystal pieces with said respective sides of said optically polished surfaces in intimate optical contact so they are optically combined; uniformly heating said stack of single-crystal pieces to a predetermined temperature; gradually cooling said stack of single-crystal pieces; said heating and gradual cooling being performed at least twice so that said stack of single-crystal pieces are integrated and assimilated together into a single-crystal unit with said respective optically contacting faces being chemically bonded.

12. The process according to claim 2 in which said synthetic single-crystal pieces are selected from the group consisting of synthetic spinel and synthetic corundum.

* * * * *